(12) United States Patent
Raddant et al.

(10) Patent No.: US 7,253,682 B2
(45) Date of Patent: Aug. 7, 2007

(54) ANTENNA AMPLIFIER

(75) Inventors: Hans-Joachim Raddant, Berlin (DE); Ralf Schultze, Berlin (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 10/240,511

(22) PCT Filed: Mar. 9, 2001

(86) PCT No.: PCT/DE01/00882

§ 371 (c)(1),
(2), (4) Date: Mar. 27, 2003

(87) PCT Pub. No.: WO01/73946

PCT Pub. Date: Oct. 4, 2001

(65) Prior Publication Data

US 2003/0160655 A1 Aug. 28, 2003

(30) Foreign Application Priority Data

Mar. 28, 2000 (DE) ................... 100 15 315

(51) Int. Cl.
*H03F 1/30* (2006.01)
(52) U.S. Cl. ............... 330/143; 330/145; 330/289; 333/17.3; 333/33
(58) Field of Classification Search .............. 333/17.3, 333/32, 33, 263; 330/145, 143, 289
See application file for complete search history.

(56) References Cited

U.S. PATENT DOCUMENTS

| 3,624,561 | A | * | 11/1971 | Tonque |
| 3,801,522 | A | | 4/1974 | Muszkiewicz |
| 5,508,656 | A | | 4/1996 | Jaffard et al. |
| 5,699,071 | A | | 12/1997 | Murakami et al. |
| 6,272,323 | B1 | * | 8/2001 | Kurihara |

FOREIGN PATENT DOCUMENTS

| EP | 0 781 000 | | 6/1997 |
| EP | 0 969 596 | | 1/2000 |
| GB | 2 266 422 | | 10/1993 |
| JP | 346807 | * | 2/1991 |

OTHER PUBLICATIONS

Seki et al. "A Three-Dimensional Active Antenna for a High-Speed Wireless Communication Application" IEEE MTT-S Microwave Symposium Digest Jun. 8-13, 1997 vol. 2 pp. 975-978.*

* cited by examiner

Primary Examiner—Michael B Shingleton
(74) Attorney, Agent, or Firm—Kenyon & Kenyon LLP

(57) ABSTRACT

The antenna amplifier for mobile FM radio reception includes a signal amplifier, a controllable adjusting element having a PIN diode for impedance adaptation, and a control amplifier for regulating the adjusting element. The antenna amplifier has a compensation for the temperature response occurring as a result of very great differences (summer/winter) in ambient temperature, the PIN diode connection point is optimized, and the control range is maximized.

18 Claims, 5 Drawing Sheets

ANTENNA AMPLIFIER

FIELD OF THE INVENTION

The invention relates to an antenna amplifier for mobile FM radio reception having a signal amplifier, a control amplifier, and a controllable adjusting element for adapting the impedance and for damping the antenna signal. The present invention additionally concerns a controllable adjusting element of this kind.

BACKGROUND INFORMATION

The existing art describes FM antenna amplifiers that are used for mobile reception in order to improve radio reception if antennas either are poorly adapted and/or possess low antenna efficiency. In the context of reception close to the transmitter, very high levels occur in the antenna amplifier and also in the car radio downstream. These high levels cause an intermodulation which interferes with reception if the frequency of an intermodulation product coincides with the reception channel that is selected. To prevent these kinds of interference, antenna amplifiers having a level setting element at the amplifier input are used. The result, when the preset control threshold is reached, is that the level at the output of the control element and the intermodulation products no longer rise even if the intermodulation products continue to increase, i.e. continue to rise. This applies, however, only to the control range implemented within the circuit. Above the control range, the output level rises to the same degree as the input level.

Amplifiers having these aforementioned features are known, and are exported e.g. to the United States. Such amplifiers are used in particular in motor vehicles that are intended for export to the United States. The known amplifiers have the following substantial disadvantages:

The magnitude of the controlled output level depends greatly on the ambient temperature. In addition, the control range—i.e. the range within which the output level remains constant as the input level rises—is insufficiently wide.

The result of the dependency on ambient temperature is that in a cold winter, when temperatures of e.g. −40° C. can occur at the antenna amplifier, the controlled output level will have a value different from that in a hot summer, when the temperature at the antenna amplifier can rise to approx. 90° C. The behavior of the reception system when passing through strong signal areas therefore depends on the season.

The inadequate control range means that the input level is damped by only a few decibels in the adjusting element. This yields almost no improvement in reception, since intermodulation is only slightly suppressed.

FIG. 5 shows the circuit diagram of an antenna amplifier according to the existing art in which the output level is regulated. The antenna amplifier has a signal amplifier V, a control circuit RS that controls a PIN diode, and an antenna adapter A having an input HF-E for the antenna signal and an output HF-A for the amplified signal. A small portion of the power of the output signal of signal amplifier V is diverted to a rectifier Dg, Rg, Cg. In control circuit RS, a rectified voltage Ub is amplified in a first operational amplifier stage OP1 and integrated in second stage OP2. The output signal controls a PIN diode PIN whose anode is connected to the positive voltage and has a high-frequency connection to ground by way of a capacitor. Diode PIN short-circuits the HF voltage to ground when it is completely conductive. The temperature dependency occurs in diode Dg of the HF rectifier. To ensure that the wide fluctuation range in the conducting-stage voltage that occurs here does not result in malfunctions, the value of the control threshold is selected so that the resulting rectified voltage is high compared to the temperature-related fluctuation range of the conducting-state voltage. With this known amplifier device, the object is achieved by the fact that the output voltage is picked off at the high point of a series oscillator circuit Ls/Cs, where the voltage is higher (because of the high impedance) than directly at the amplifier output. A high voltage is present at rectifier diode Dg, however, and causes an intermodulation problem there.

The size of the control range and thus the maximum damping achievable by way of PIN diode PIN depends here on the antenna impedance, which together with PIN diode PIN forms a voltage divider. The ratio of this voltage divider is high in order to yield a high level of antenna signal damping. This is achievable if the antenna's source impedance is high, but that impedance varies greatly in frequency-dependent fashion. As the impedance fluctuates, the damping frequency response that results at the maximum PIN diode current is also inhomogeneous.

SUMMARY OF THE INVENTION

It is therefore an object of the present invention to create an antenna amplifier of the kind cited initially, and a circuit for adapting the antenna signal, which result in an increase in the intermodulation separation in the control range and greatly improve the dependency of the regulated output level on ambient temperature.

With the present invention, antenna adaptation is performed in two steps in an adjusting element having at least one PIN diode. In the first step, adaptation of the antenna to the PIN diode is performed in an adaptation system embodied as a subassembly, with the goal of achieving the greatest possible damping with a low frequency response. In the second step, in a second adaptation circuit, adaptation to the impedance of the amplifier is accomplished in a second subassembly connected in series.

The PIN diode can be connected in either parallel or serial fashion. With a parallel-connected diode, the antenna impedance is transformed into the high-resistance range by the first adaptation system. With a series-connected diode, the antenna impedance is transformed into the low-resistance range by the first adaptation system.

In the antenna amplifier according to the present invention for mobile FM radio reception, which includes a signal amplifier, an adjusting element both for adapting the antenna impedance to the impedance of the signal amplifier and for damping the antenna signal, and a control amplifier, the PIN diode of the adjusting element has a control signal applied to it by the control amplifier.

A rectifier having two diodes is positioned in the control amplifier, which derives a control signal from the HF signal present at the output of the signal amplifier. In order to compensate for temperature fluctuations, the two diodes are thermally coupled to one another, for example by being positioned on a common support element.

DETAILED DESCRIPTION

The descriptions below of the embodiments of the adjusting elements are limited to the use of only one PIN diode. The advantage of a single PIN diode (as compared to multiple PIN diodes positioned as T- or pi-elements or -semi-elements) is that control complexity is low. The use of more than one PIN diode in an adjustment element is nevertheless not excluded; in such a case the currents of the PIN diodes are coordinated with one another, and parallel-connected diodes are triggered with a 180-degrees shift in phase with respect to series-connected diodes, thereby greatly increasing complexity as compared to the solution using one PIN diode.

Figure 1:
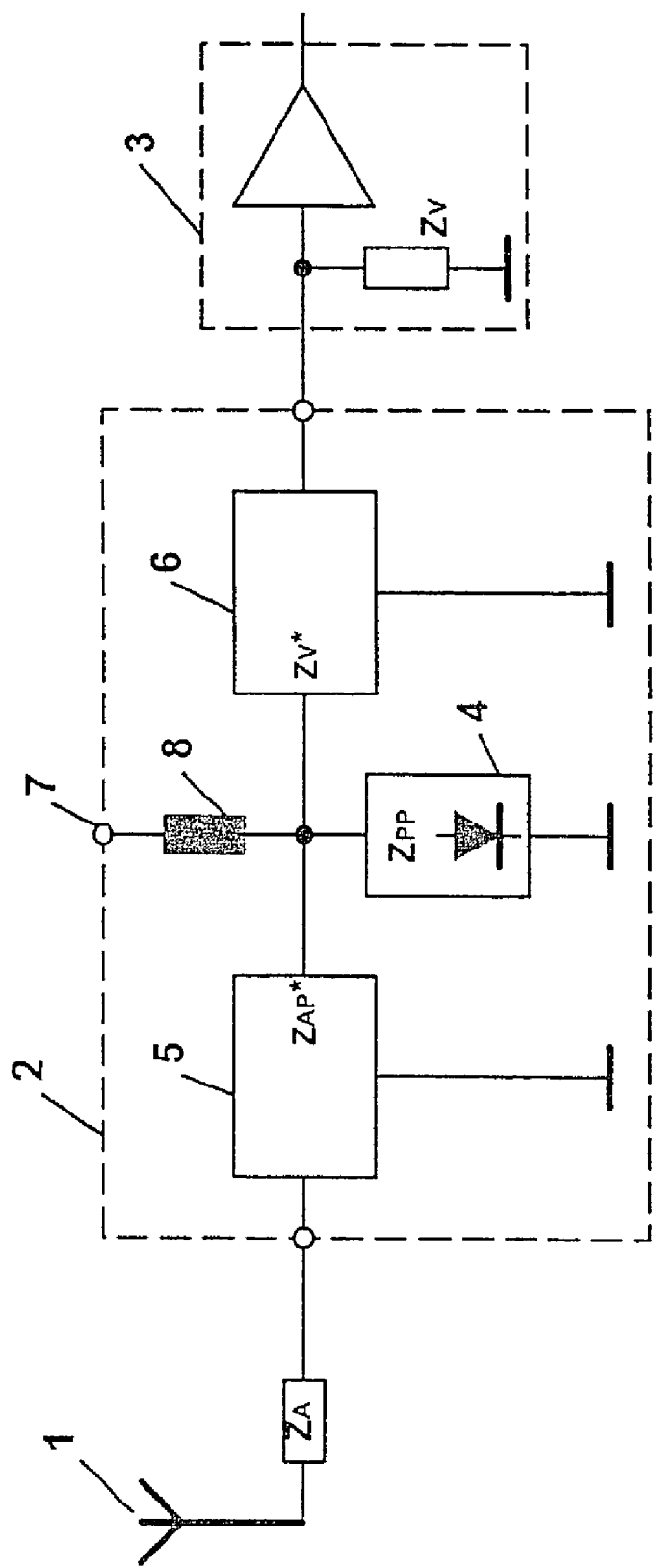
FIG. 1 is a block diagram of an adjusting element according to the present invention having a parallel PIN diode.

FIG. 1 shows a controllable adjusting element 2 that is connected between an antenna 1 having an antenna impedance $Z_A$ and an antenna amplifier 3 having an input impedance $Z_V$. Adjusting element 2 encompasses a parallel-connected PIN diode 4, an adaptation system 5 and 6 being positioned respectively in front of and behind diode 4. Adjusting element 2 furthermore has a control input 7. Adaptation of antenna impedance $Z_A$ to impedance $Z_V$ of amplifier 3 is accomplished in two steps, i.e. by way of first adaptation system 5, with which the antenna impedance is transformed to a first intermediate impedance $Z_{AP}^*$ for adaptation to impedance $Z_{PP}$ of diode 4; and by way of second adaptation system 6, with which first intermediate impedance $Z_{AP}^*$ is transformed to a second intermediate impedance $Z_V^*$ in order to adapt PIN diode 4 to impedance $Z_V$ of amplifier 3.

For maximum damping with low frequency response in the context of a parallel PIN diode 4 in FIG. 1, antenna impedance $Z_A$ is transformed into the high-resistance range symmetrically with respect to the real axis ($Z_{AP}^*$).

Figure 3:
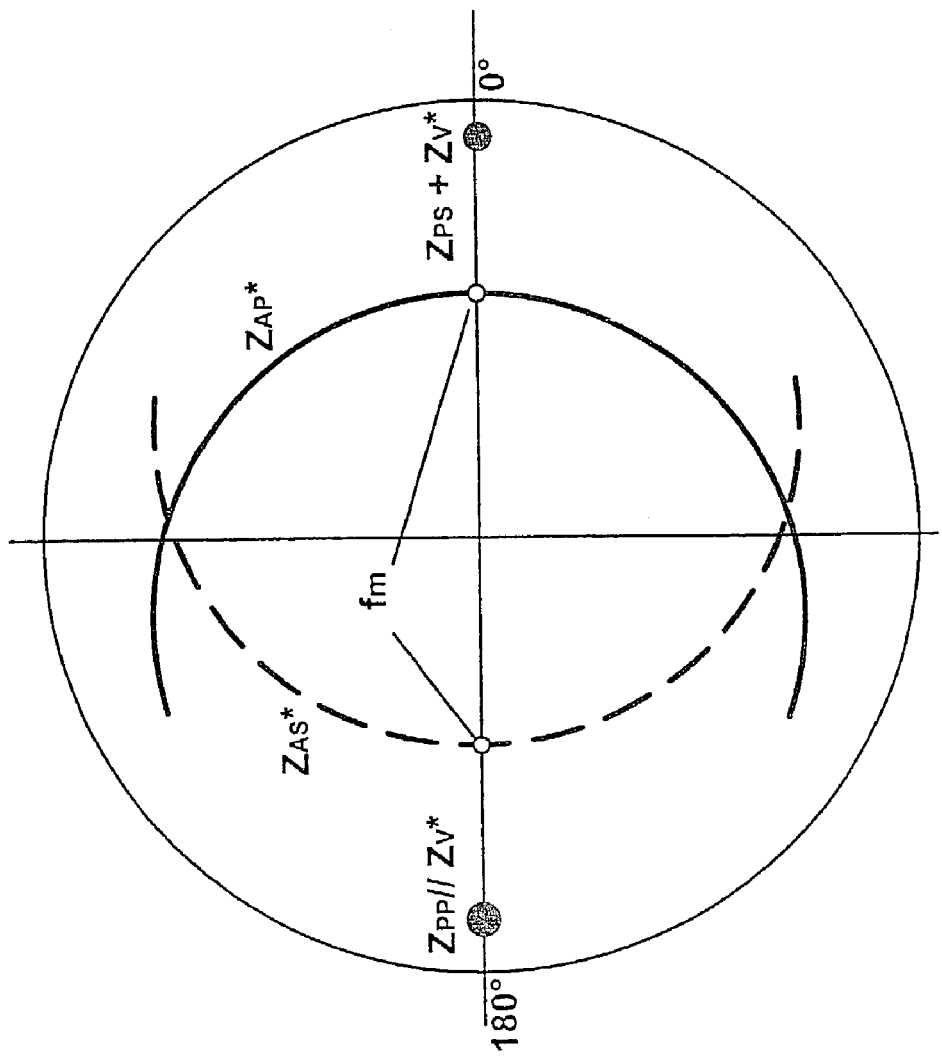
FIG. 3 shows the complex reflection factors of the PIN diode and antenna for parallel and serial connection of the PIN diode.

FIG. 3 compares an exemplary antenna impedance curve ZAP* to the impedance that results when PIN diode impedances $Z_{PP}$ and the transformed input impedance $Z_V^*$ of the connected amplifier are connected in parallel ($Z_{PP}//Z_V^*$ in FIG. 3). Under the impedance conditions depicted, the mismatch between the source having impedance $Z_{AP}^*$ and the load having impedance $Z_{PP}//Z_V^*$ is maximal, and the output power minimal, when diode 4 is activated. The damping maximum lies at the center of the transmission frequency range. With this action, the frequency response of the entire amplifier is largely flat not only in the undamped case (thanks to the two adaptation subassemblies) but also in the damped case described above. The center frequency is indicated by the arrows and labeled $f_m$.

Figure 2:
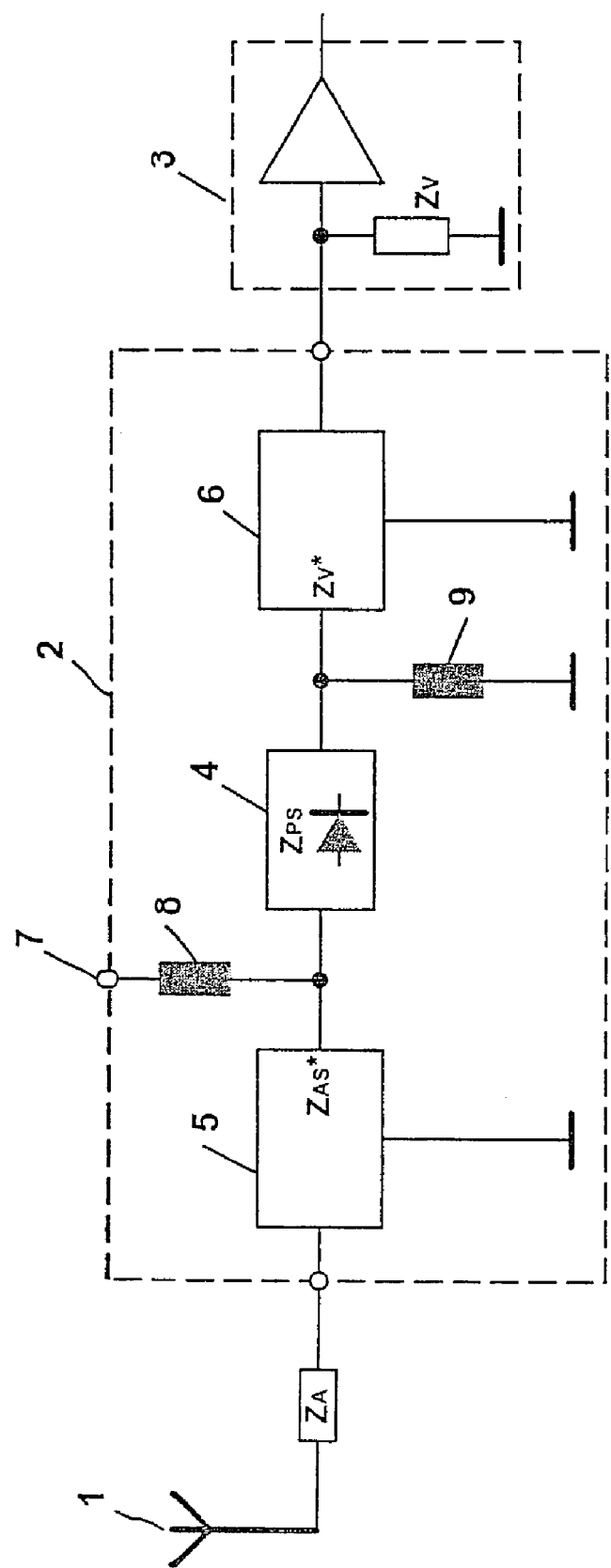
FIG. 2 is a block diagram of an adjusting element according to the present invention having a serial PIN diode.

FIG. 2 illustrates the situation in which PIN diode 4 is positioned in series. Here again an adjusting element 2 is positioned between an antenna 1 and an amplifier 3, adjusting element 2 having a first adaptation system 5 for adapting antenna impedance $Z_A$ to PIN diode 4 and a second adaptation system 6 for adapting PIN diode 4 to amplifier impedance $Z_V$. Adjusting element 2 furthermore has a control input 7 that is connected via an inductance 8 to the anode of diode 4. On the cathode side, a further inductance 9 is connected to ground.

With the series circuit, the finite conductance of diode 4 means that even when it is switched on, it causes a signal damping of at least 0.5 to 2 dB (depending on impedance conditions) and thus degrades the signal-to-noise ratio by the same amount. If PIN diode 4 is switched off, on the other hand, it is generally possible to achieve higher damping values than with the parallel circuit.

In the serial case, maximum damping is achieved when diode 4 is inhibited. For maximum damping when the serial PIN diode 4 is switched off, antenna impedance $Z_A$ is therefore transformed into the low-resistance range symmetrically with respect to the real axis. FIG. 3 compares, in this context, an exemplary transformed antenna impedance $Z_{AS}^*$ to the impedance that results when PIN diode impedance $Z_{PS}$ and the transformed amplifier input impedance $Z_V^*$ are connected in series in the serial instance of FIG. 2, i.e. $Z_{PS}+Z_V^*$. Under the impedance conditions depicted, the mismatch between the source with impedance $Z_{AS}^*$ and the load with impedance $Z_{PS}+Z_V^*$ is maximal, and the output power therefore minimal, when diode 4 is switched off.

The input impedance when amplifier 3 is connected has no perceptible influence on the maximum achievable damping with either a parallel or a serial PIN diode 4, since with a parallel circuit it is large compared to the PIN diode impedance, and with a series circuit it is small compared to the PIN diode impedance.

Lastly, it should be mentioned that the use of adjusting elements having multiple PIN diodes creates the problem that the currents of the individual diodes are to be matched to one another. In addition, parallel-connected diodes are to be triggered with a phase shift of 180 degrees with respect to series-connected diodes. That increases complexity, so that in vehicle antenna amplifiers, an approach with only one parallel-connected diode is preferred. A pi- or T-element, or pi- or T-semi-elements, would be suitable for a circuit arrangement having multiple PIN diodes.

Figure 4:
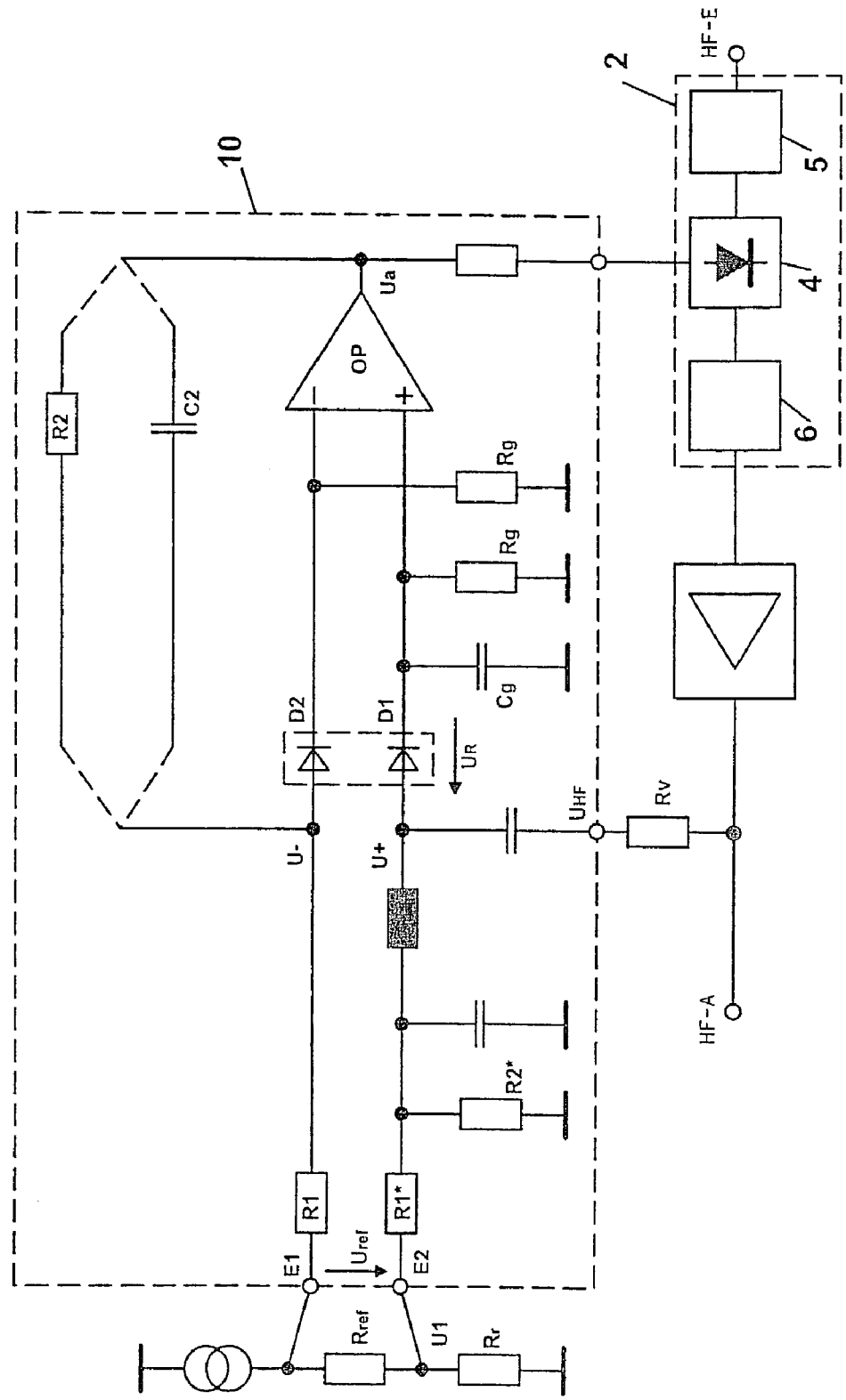
FIG. 4 shows an antenna amplifier according to the present invention having a proportional or integral rectifier control amplifier.
Figure 5:
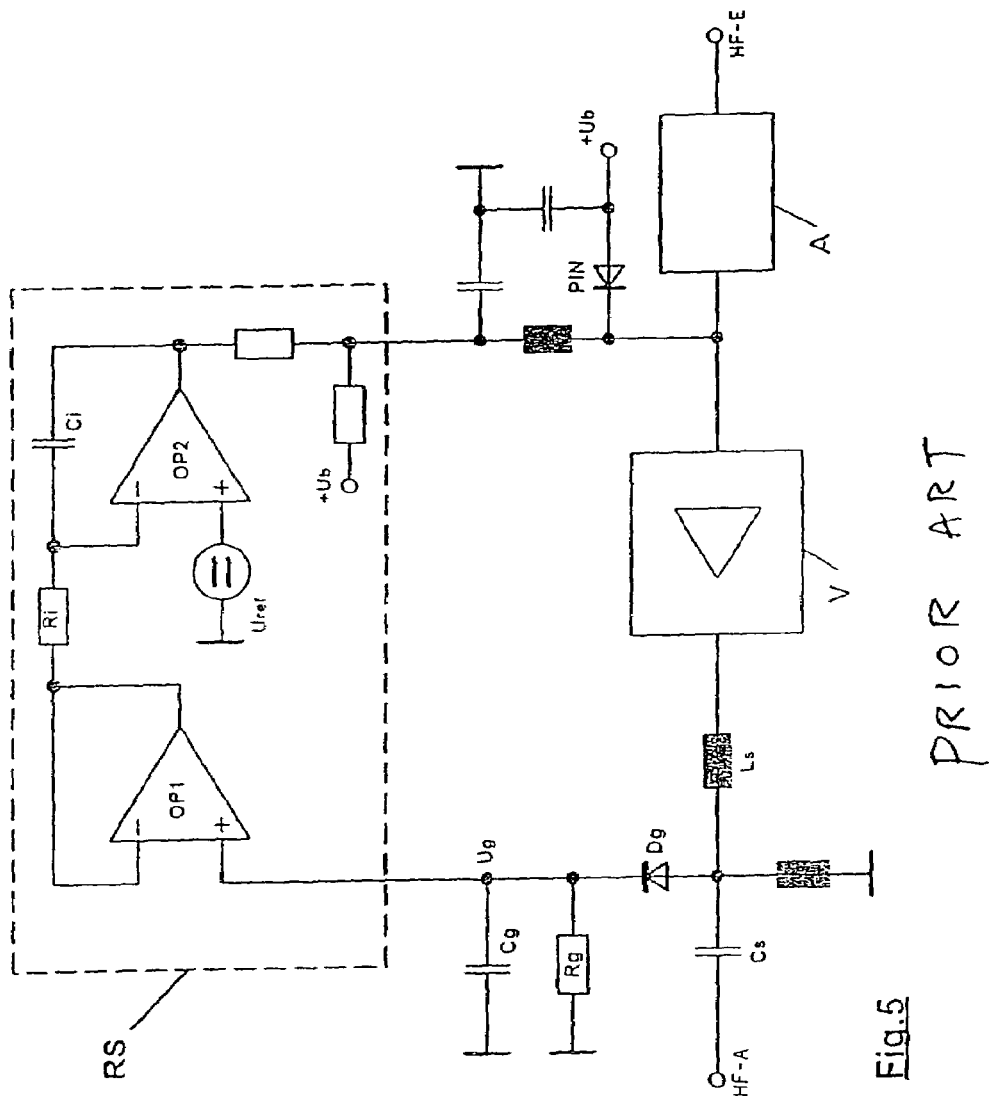
FIG. 5 shows an antenna amplifier according to the existing art.

FIG. 4 shows a circuit diagram of an antenna amplifier according to the present invention having a signal amplifier 3, control amplifier 10, and adjusting element 2, PIN diode 4 of adjusting element 2 being regulated by the output signal of control amplifier 10. The antenna amplifier furthermore has an input HF-E for the antenna signal (not depicted), and an output HF-A for the amplified signal. The first case to be considered is that in which resistor R2, and not capacitor C2, is connected at the top in control amplifier 10 of FIG. 4. In this case control amplifier 10 acts as a proportional rectifier control amplifier. Operational amplifier OP, together with the four resistors R1, R2, R1*, and R2*, constitutes a subtracter with input voltage U1 at input E2 and summed voltage U1+Uref at input E1. In the preferred embodiment resistors R1 and R1* are identical, as are R2 and R2*. Below the control threshold, output voltage Ua of operational amplifier OP is Ua=−Uref*(R2/R1) when operational amplifier OP is being supplied with operating voltage that is positive and negative with respect to ground potential. If the operating voltage is only positive, Ua=0 volts. The two diodes D1 and D2 represent voltage sources connected in series with the inputs of operational amplifier OP. Flowing through each of them is an identical quiescent current that is determined substantially by voltages U1 and Uref (Uref being small compared to U1) and by resistors Rg. In order to achieve thermal coupling, the two diodes D1 and D2 are located in the same housing or on the same chip, and therefore have almost identical temperature coefficients. The conducting-state voltages of diodes D1, D2 therefore change to the same degree if the ambient temperature changes. The output voltage remains unchanged.

The HF voltage UHF coupled out at the output of amplifier 3 produces at diode D1 a rectified voltage UR that is amplified by the factor R2/R1. The control threshold is set by way of resistor Rref (only when UR>Uref is there a positive output voltage of operational amplifier OP and therefore a current through PIN diode 4), and the slope of the control characteristic is set by way of the resistance ratio R2/R1. The slope of the control characteristic is an indication of the rise in the HF output voltage in relation to the HF input voltage within the control range. A system deviation still exists with this control principle, but control happens very quickly because all that is required is for capacitor Cg in the HF rectifier to recharge.

If capacitor C2, rather than resistor R2, is connected in control amplifier 10 in the antenna amplifier shown in FIG. 4, the result is an antenna amplifier having an integral rectifier control amplifier 10. In the integrator, the rectified voltage is integrated and amplified as defined by the following formula:

$$Ua = -\frac{1}{R1*C2} * \int_0^1 (Uref - UR(t))dt.$$

The integrator eliminates any system deviation. This means that the regulated output level of the antenna amplifier remains constant within the control range. At HF levels below the control threshold, the output voltage of integral rectifier control amplifier 10 is Ua=0 V. The value of the regulated output voltage is set using Uref: only when the difference Uref–UR yields a positive value does the output voltage of operational amplifier OP also become positive, so that a current flows through PIN diode 4.

Resistor Rv reduces the power level diverted to the rectifier and thus improves the intermodulation spacing.

The invention claimed is:

1. An antenna amplifier for mobile FM radio reception, comprising:
   a signal amplifier;
   an adjusting element including:
      at least one PIN diode for adapting an impedance of an antenna to an impedance of a signal amplifier,
      a first adaptation system for adapting the impedance of the antenna to an impedance of the at least one PIN diode, and
      a second adaptation system for adapting the impedance of the at least one PIN diode to the impedance of the signal amplifier;
   a control amplifier for regulating the adjusting element;
   four resistors, wherein:
      the operational amplifier of the control amplifier and the four resistors form a subtracter having a first input voltage at a second input and a second input voltage at a first input of the control amplifier; and
      two diodes representing voltage sources connected in series with inputs of the operational amplifier, each of the two diodes being traversed by an approximately identical quiescent current that is determined by respective voltages and resistors, the two diodes being thermally coupled in mechanical fashion in such a way that the two diodes have approximately identical temperature coefficients, wherein:
         a HF voltage coupled out at an output of the signal amplifier produces at one of the two diodes a rectified voltage that is amplified by a factor;
   wherein the control amplifier includes:
      a rectifier for a rectified voltage, and
      an operational amplifier that amplifies the rectified voltage.

2. An antenna amplifier for mobile FM radio reception, comprising:
   a signal amplifier;
   an adjusting element including:
      at least one PIN diode for adapting an impedance of an antenna to an impedance of a signal amplifier,
      a first adaptation system for adapting the impedance of the antenna to an impedance of the at least one PIN diode, and
      a second adaptation system for adapting the impedance of the at least one PIN diode to the impedance of the signal amplifier;
   a control amplifier for regulating the adjusting element;
   a capacitor;
   three resistors, wherein:
      the operational amplifier of the control amplifier, the three resistors, and the capacitor form an integrating subtracter having a first input voltage at a first input and a second input voltage at a second input of the control amplifier; and
      two diodes representing voltage sources connected in series with inputs of the operational amplifier, each of the two diodes being traversed by an approximately identical quiescent current that is determined by respective voltages and resistors, the two diodes being thermally coupled in mechanical fashion in such a way that the two diodes have approximately identical temperature coefficients, wherein:
         a HF voltage coupled out at an output of the signal amplifier produces at one of the two diodes a rectified voltage that is amplified by a factor;
   wherein the control amplifier includes:
      a rectifier for a rectified voltage, and
      an operational amplifier that amplifies the rectified voltage.

3. The antenna amplifier as recited in claim 1, further comprising:
   a resistor for setting the quiescent current; and
   a resistor for setting a control threshold.

4. The antenna amplifier as recited in claim 1, further comprising:
   a resistor for reducing a power diverted to the control amplifier.

5. An antenna amplifier, comprising:
   a controllable adjusting arrangement, which includes:
   at least one PIN diode for adapting an impedance of an antenna to an impedance of a signal amplifier,
   a first adaptation system for adapting the impedance of the antenna to an impedance of the at least one PIN diode, and
   a second adaptation system for adapting the impedance of the at least one PIN diode to the impedance of a signal amplifier;
   a control amplifier coupled to the controllable adjustable arrangement to control the controllable adjustable arrangement, the control amplifier including:
   an amplifier and resistor arrangement, wherein the amplifier and resistor arrangement form a subtracter to provide a first input voltage at a second input and a second input voltage at a first input of the control amplifier, and
   a diode arrangement to represent voltage sources coupled in series with inputs of the amplifier of the amplifier and resistor arrangement, each diode of the diode arrangement being thermally coupled so that each of the diodes has approximately the same temperature coefficient.

6. The antenna amplifier as recited in claim 5, wherein an HF voltage at an output of the signal amplifier is to provide an amplified and rectified voltage at a diode of the diode arrangement.

7. The antenna amplifier as recited in claim 5, wherein the amplifier and resistor arrangement includes four resistors.

8. The antenna amplifier as recited in claim 5, wherein each diode of the diode arrangement is arranged to receive an approximately identical quiescent current.

9. The antenna amplifier as recited in claim 5, wherein:
an HF voltage at an output of the signal amplifier produces an amplified and rectified voltage at a diode of the diode arrangement,
the amplifier and resistor arrangement includes four resistors, and
each diode of the diode arrangement is arranged to receive an approximately identical quiescent current.

10. The antenna amplifier as recited in claim 9, wherein the amplifier and resistor arrangement includes an operational amplifier.

11. The antenna amplifier as recited in claim 9, further comprising:
a "quiescent current" resistor to set the quiescent current; and
a "control threshold" resistor to set a control threshold.

12. The antenna amplifier as recited in claim 9, further comprising:
a "reduce power" resistor to reduce power diverted to the control amplifier.

13. The antenna amplifier as recited in claim 5, wherein the amplifier and resistor arrangement includes an operational amplifier.

14. The antenna amplifier as recited in claim 5, wherein the amplifier and resistor arrangement includes an operational amplifier, a capacitor, an a plurality of resistors, all of which together form an integrating subtracter to provide a first input voltage at a first input of the control amplifier and a second input voltage at a second input of the control amplifier.

15. The antenna amplifier as recited in claim 5, further comprising:
a "quiescent current" resistor to set the quiescent current; and
a "control threshold" resistor to set a control threshold.

16. The antenna amplifier as recited in claim 5, further comprising:
a "reduce power" resistor to reduce power diverted to the control amplifier.

17. The antenna amplifier as recited in claim 5, wherein the at least one PIN diode is only one PIN diode.

18. The antenna amplifier as recited in claim 1, wherein the at least one PIN diode is only one PIN diode.

* * * * *